(12) United States Patent
Saitou et al.

(10) Patent No.: US 8,097,946 B2
(45) Date of Patent: Jan. 17, 2012

(54) DEVICE MOUNTING BOARD, SEMICONDUCTOR MODULE, AND MOBILE DEVICE

(75) Inventors: Kouichi Saitou, Gifu (JP); Mayumi Nakasato, Ogaki (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 538 days.

(21) Appl. No.: 12/263,174

(22) Filed: Oct. 31, 2008

(65) Prior Publication Data

US 2009/0115056 A1   May 7, 2009

(30) Foreign Application Priority Data

Oct. 31, 2007   (JP) ................. 2007-284470
Oct. 22, 2008   (JP) ................. 2008-272393

(51) Int. Cl.
*H01L 23/053* (2006.01)
*H01L 23/12* (2006.01)

(52) U.S. Cl. ................ 257/700; 257/E23.173; 257/692; 257/698; 257/737; 438/122; 438/125; 174/256; 174/262

(58) Field of Classification Search ........... 257/E23.026, 257/692, 698, 700, 712, 713, 737, 758, 774, 257/E23.173, E21.506, 686; 438/118, 121–123, 438/125; 428/209, 901; 174/256, 258, 262, 174/266; 29/846, 852
See application file for complete search history.

(56) References Cited

U.S. PATENT DOCUMENTS

| | | | | | |
|---|---|---|---|---|---|
| 4,153,988 | A | * | 5/1979 | Doo ................................. | 29/827 |
| 5,065,228 | A | * | 11/1991 | Foster et al. ................... | 257/698 |
| 5,527,741 | A | * | 6/1996 | Cole et al. ..................... | 438/107 |
| 5,808,874 | A | * | 9/1998 | Smith ........................... | 361/769 |
| 6,000,130 | A | * | 12/1999 | Chang et al. .................... | 29/852 |
| 6,518,514 | B2 | * | 2/2003 | Suzuki et al. ................. | 174/262 |
| 6,693,029 | B2 | * | 2/2004 | Iijima et al. ................... | 438/622 |
| 6,753,600 | B1 | * | 6/2004 | Ho ................................ | 257/698 |
| 7,041,534 | B2 | * | 5/2006 | Chao et al. ..................... | 438/114 |
| 7,109,068 | B2 | * | 9/2006 | Akram et al. ................. | 438/128 |
| 7,318,729 | B2 | * | 1/2008 | Sato et al. ....................... | 439/66 |
| 7,880,307 | B2 | * | 2/2011 | Farnworth et al. ............. | 257/774 |
| 2002/0180027 | A1 | * | 12/2002 | Yamaguchi et al. ........... | 257/700 |

FOREIGN PATENT DOCUMENTS

JP   2007-150355   6/2007

* cited by examiner

*Primary Examiner* — Chris Chu
(74) *Attorney, Agent, or Firm* — McDermott Will & Emery LLP

(57) ABSTRACT

A device mounting board includes an insulating layer formed of an insulating resin, a glass cloth covering the surface of the insulating layer, and an electrode provided in a through hole extending through the glass cloth. The angle of contact with solder of the glass cloth is larger than that of the resin. Thus, solder bumps are formed on the electrode 14 of the device mounting board 10 with high precision.

9 Claims, 19 Drawing Sheets

DEVICE MOUNTING BOARD, SEMICONDUCTOR MODULE, AND MOBILE DEVICE

CROSS-REFERENCE TO RELATED APPLICATIONS

This application is based upon and claims the benefit of priority from the prior Japanese Patent Application No. 2007-284470, filed on Oct. 31, 2007, and Japanese Patent Application No. 2008-272393, filed on Oct. 22, 2008, the entire contents of which are incorporated herein by reference.

BACKGROUND OF THE INVENTION

1. Field of the Invention

The present invention relates to a device mounting board and a semiconductor module provided with a mounting board.

2. Description of the Related Art

In recent years, circuit elements such as LSI have become more sophisticated in their function and performance. Consequently, the need arises for a large number of pins and fine pitch in circuit elements such as LSIs. Associated with this, packaging boards are required to be smaller and allow higher density packaging. Accordingly, the need arises to form bumps adapted for a large number of pins and fine pitch packaging on a packaging board.

One known method of manufacturing a bumped board is adapted to forming bumps on a large number of electrodes and comprises feeding a resin containing solder particles and an additive having a boiling point to the surface of a substrate having a plurality of electrodes, bringing a plate into contact with the surface of the resin supplied to the surface of the substrate, supporting the substrate and the plate so that the distance between them remains constant, heating the resin at a temperature equal to or higher than the boiling point of the additive and equal to or higher than the temperature at which the solder particles are melted, and forming bumps by aggregating the solder particles on the electrodes.

However, the known method requires the use of a resin containing a special additive. As such, the method may increase the manufacturing cost.

SUMMARY OF THE INVENTION

The present invention addresses the problem and its general purpose is to provide a device mounting board (a board for mounting a semiconductor chip or semiconductor chips) in which solder bumps are formed on electrodes easily and highly precisely.

The device mounting board according to at least one aspect of the present invention comprises: an insulating layer formed of an insulating resin; a covering that coats the surface of the insulating layer; and an electrode provided in an area surrounded by the covering. The covering has an angle of contact with solder larger than that of the resin.

According to this aspect, when molten solder is supplied to the covering in order to form solder bumps on the electrode, the solder is likely to flow toward the electrode provided in an area surrounded by the covering. This is because the covering around the electrode has an angle of contact with solder larger than that of the resin so that the solder is more likely to be repelled on the covering. The term "area surrounded by the covering" encompasses not only a case where the electrode is completely surrounded but also a case where the electrode is partly surrounded.

The device mounting board according to another aspect of the present invention comprises: an insulating layer formed of an insulating resin; a covering that coats the surface of the insulating layer; and an electrode provided in a through hole extending through the covering. The covering has an angle of contact with solder larger than that of the resin.

According to this aspect, when molten solder is supplied to the covering in order to form solder bumps on the electrode, the solder is likely to flow toward the electrode. This is because the covering around the electrode has an angle of contact with solder larger than that of the resin so that the solder is more likely to be repelled on the covering.

The electrode may be formed such that the exposed surface of the electrode is located inside the through hole.

The covering may have higher heat conductivity than that of the resin.

The covering may be formed of glass fiber.

The covering may be a glass cloth formed such that glass fibers oriented in a plurality of intersecting directions are woven.

The covering may have elevations and recesses.

The device mounting board according may further comprise; a wiring layer formed on the surface of the insulating layer opposite to the surface on which the covering is formed; and a via conductor electrically connecting the electrode with the wiring layer.

Another aspect of the present invention relates to a semiconductor module. The semiconductor module comprises: a semiconductor device having an electrode terminal; and a device mounting board. The electrode terminal and the electrode are bonded by solder.

According to this aspect, since the device mounting board and the semiconductor device are bonded via the solder bump formed on the electrode of the device mounting board with precision, the reliability of the semiconductor module is improved.

Another aspect of the present invention relates to a mobile device. The mobile device may carry the semiconductor module described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

A description will be given below of embodiments of the present invention with reference to the drawings. In the figures, like numerals represent like elements, and the description thereof is omitted appropriately. The embodiments as described hereinafter are non-limiting examples of reducing the invention to practice.

First Embodiment

Figure 1:
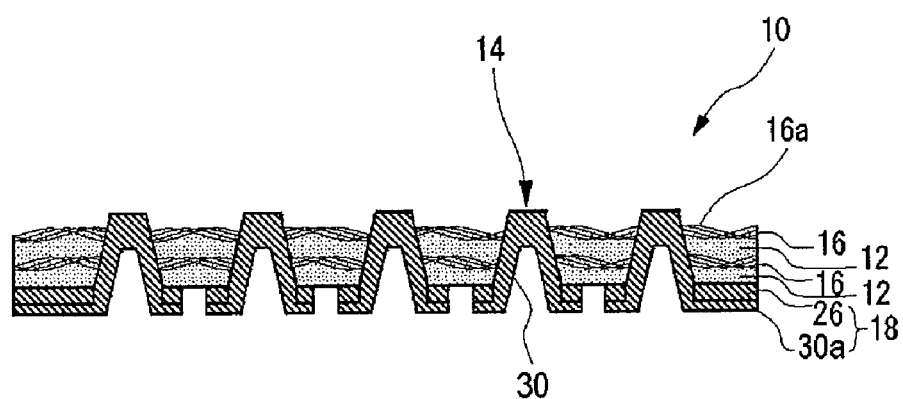
FIG. 1 is a sectional view showing the schematic structure of a device mounting board according to the first embodiment.

FIG. 1 is a sectional view showing the schematic structure of a device mounting board according to the first embodiment. A device mounting board 10 for carrying devices is provided with an insulating layer 12 formed of an insulating resin and an electrode 14 provided to extend through the insulating layer 12 from the lower surface thereof to the upper surface thereof. The insulating layer 12 includes, as a filler, glass cloth 16 having higher heat conductivity than that of the resin contained in the layer. The glass cloth 16 is a fibrous filler provided such that the glass fiber is oriented to intersect a direction perpendicular to the surface of the substrate. The heat conductivity of the resin according to the first embodiment is about 0.2 W/m*K, and the heat conductivity of the glass cloth 16 is about 1.0 W/m*K. The glass cloth 16 has an exposed part 16a exposed on the surface of the insulating layer 12 on which the electrode 14 is exposed. In other words, the exposed part 16a of the glass cloth 16 functions as a covering that coats the surface of the insulating layer 12. A wiring layer 18 comprises a second conductive film 26 (described later) and a plating layer 30a formed to cover the second conductive film 26 when forming a via conductor 30.

Thus, when a semiconductor device provided with a circuit using the well-known technology is mounted on the device mounting board 10 and operated, heat in the semiconductor device can be dissipated via the glass cloth 16 having high heat conductivity. The heat of the device mounting board 10 can also be dissipated efficiently.

The wiring layer 18 is formed on the lower surface of the insulating layer 12, shown in FIG. 1, of the device mounting board 10. The electrode 14 according to the first embodiment is formed in a through hole extending through the insulating layer 12. In other words, the electrode 14 is formed in a hole extending through the glass cloth 16 and includes the via conductor 30 having one end thereof connected to the wiring layer 18. In other words, the other end of the via conductor 30 functions as an electrode connected to an electrode terminal of a semiconductor device. Copper is used to form the electrode 14 according to the first embodiment. The glass cloth 16 according to the first embodiment has an angle of contact with ordinarily used solder larger than that of the resin included in the resin layer 12. The electrode 14 is more projected than the exposed part 16a of the glass cloth 16.

A description will now be given of a method of manufacturing the device mounting board 10. FIGS. 2A through 4B are sectional views showing steps in the method of manufacturing the device mounting board according to the first embodiment.

Figure 2A:
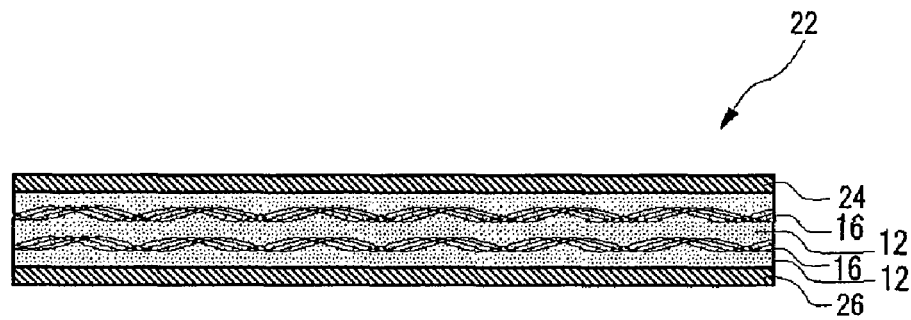
FIGS. 2A-2C are sectional views showing steps in the method of manufacturing the device mounting board according to the first embodiment.

As shown in FIG. 2A, a substrate 22 provided with the insulating layer 12 formed of an insulating resin and containing the glass cloth 16 that has an angle of contact with solder larger than that of the resin is prepared. First, a first conductive film 24 of copper is formed on one surface of the insulating layer 12 and a second conductive film 26 of copper is formed on the other surface thereof.

Figure 2B:
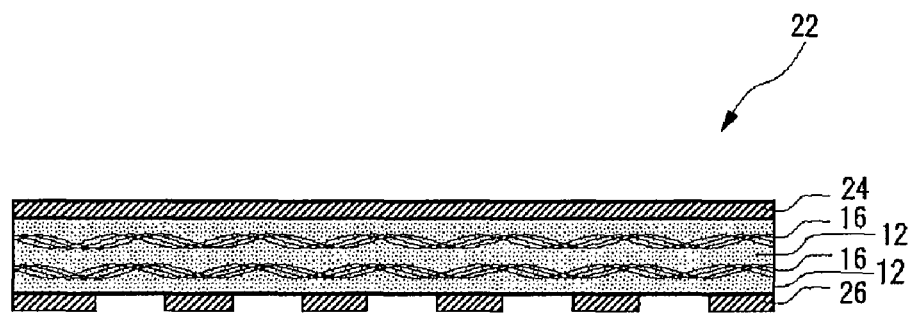

Then, as shown in FIG. 2B, the second conductive film 26 is removed using a pattern for exposing a part where a connecting hole for electrical connection between the device mounting board 10 and semiconductor devices such as LSIs is formed. The pattern is formed by lithographic exposure and etching. Preferably, the pattern is formed by wet etching using, for example, iron chloride.

Figure 2C:
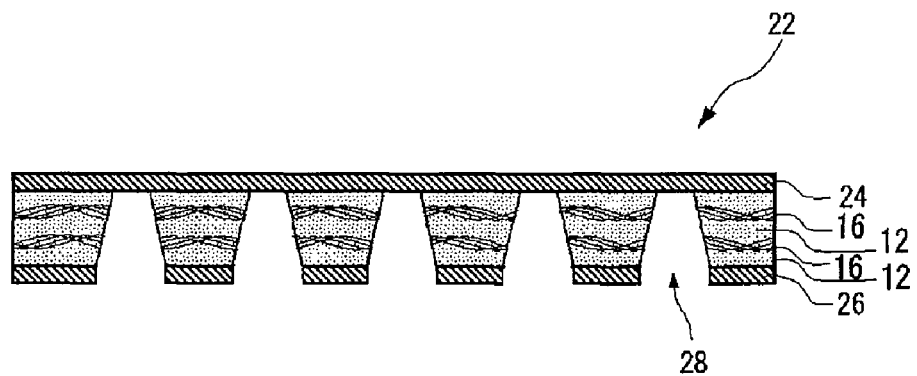

Then, as shown in FIG. 2C, the substrate is irradiated with laser in a direction facing the second conductive film 26 so as to remove a part of the insulating layer 12 until the first conductive film 24 is exposed, thereby forming an opening 28. $CO_2$ laser may be employed for laser irradiation. Laser irradiation is performed in a first condition in which a beam with high energy density is applied to achieve an arbitrary ablation depth and then in a second condition in which a beam with low energy density is applied to shape the side wall of the via. In this way, the opening 28 is formed as a via, wherein the opening 28 has a tapered side wall with a progressively smaller diameter from the surface of the insulating layer 12 (the surface of the layer shown toward the bottom of the figure and contiguous with the second conductive film 26) toward the first conductive film 24. The diameter of the opening 28 adjacent to the second conductive film 26 is about 100 μm and the diameter adjacent to the first conductive film 24 is about 80 μm.

Figure 3A:
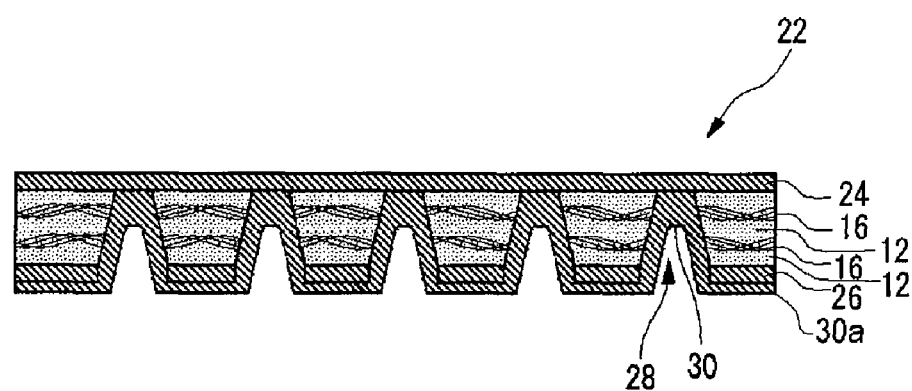
FIGS. 3A and 3B are sectional views showing steps in the method of manufacturing the device mounting board according to the first embodiment.
Figure 3B:
Figure 14:
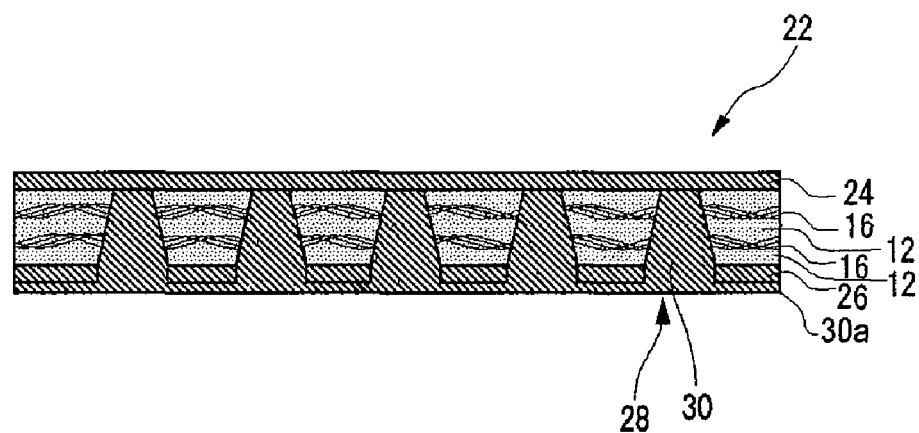
FIG. 14 is a sectional view showing a step in the method of manufacturing the device mounting board according to the first embodiment.

Then, as shown in FIG. 3A, electroless plating and electroplating are used to plate the interior surface of the opening 28 and the surface of the second conductive film 26 with copper to a thickness of about 20 μm. Consequently, the via conductor 30 is formed in the interior of the opening 28 and a plating layer 30a is formed on the second conductive film 26. The first conductive film 24 and the second conductive film 26 are connected via the via. Then, as shown in FIG. 3B, a known method is used to etch the second conductive film 26 using a certain pattern so as to form the wiring layer 18. The via conductor 30 shown in FIG. 3A is formed such that an inverse V-shaped space is created in the opening 28. Alternatively, the space may entirely be filled with copper as shown in FIG. 14. In order to entirely fill the opening 28 with copper, a longer period of time is required for plating. In this case, the plating layer 30a formed on the second conductive film 26 becomes thicker accordingly. This is addressed by adjusting the thickness of the plating layer 30a by etching back the plating layer in accordance with the current flowing in the wiring layer 18 including the second conductive film 26.

Figure 4A:
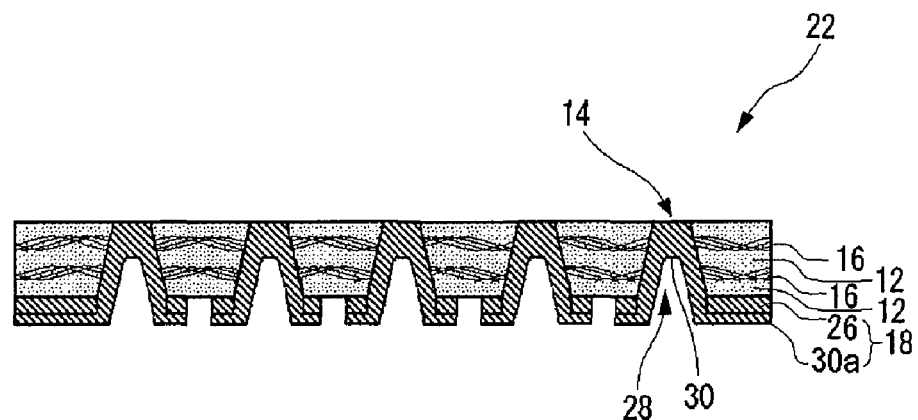
FIGS. 4A and 4B are sectional views showing steps in the method of manufacturing the device mounting board according to the first embodiment.
Figure 4B:
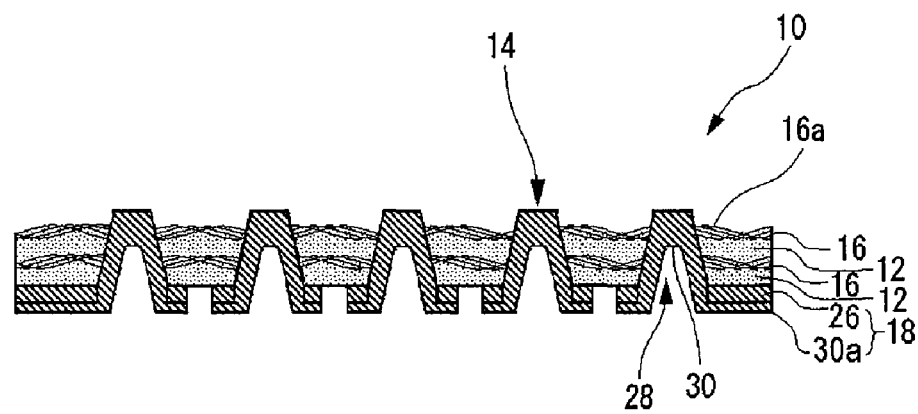

Then, as shown in FIG. 4A, the first conductive film 24 is removed by, for example, etching. This results in the electrode 14 extending through the glass cloth 16 in the insulating layer 12. Subsequently, as shown in FIG. 4B, the resin on the surface of the insulating layer 12 on which the electrode 14 is exposed is melted and removed so that a part of the glass cloth 16 is exposed. This produces the device mounting board 10. The resin may be removed by etching using $O_2$ plasma treatment so as to expose the glass cloth 16.

Figure 5:
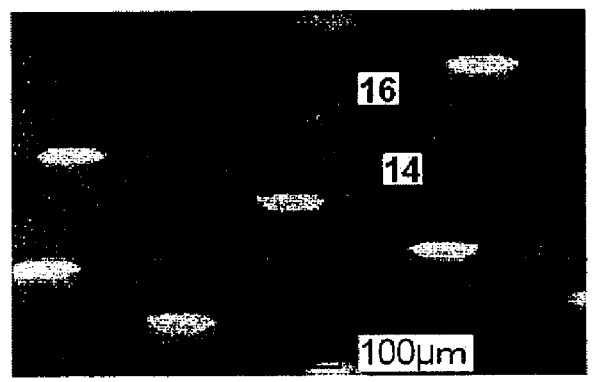
FIG. 5 is an image of the surface of the device mounting board according to the first embodiment taken with a scanning electron microscope.

FIG. 5 is an image of the surface of the device mounting board 10 according to the first embodiment taken with a scanning electron microscope. FIG. 5 shows how the electrodes 14 project from the glass cloth 16.

Figure 6:
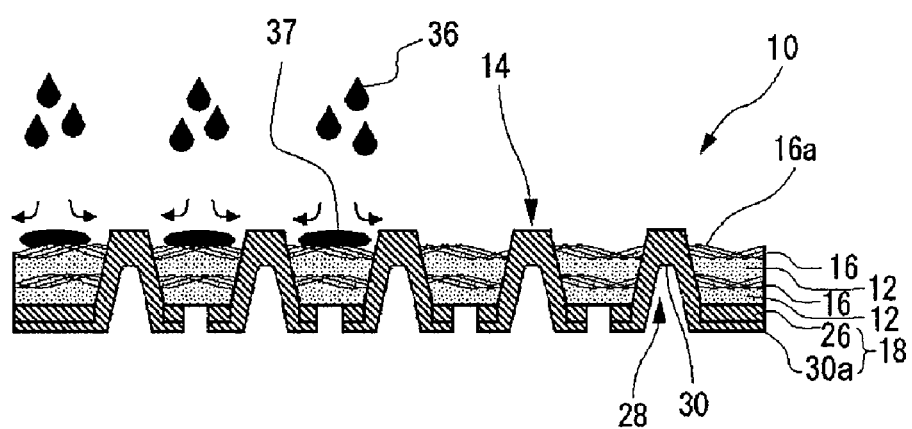
FIG. 6 is a sectional view showing a step in the method of manufacturing the solder bumped device mounting board according to the first embodiment.
Figure 7:
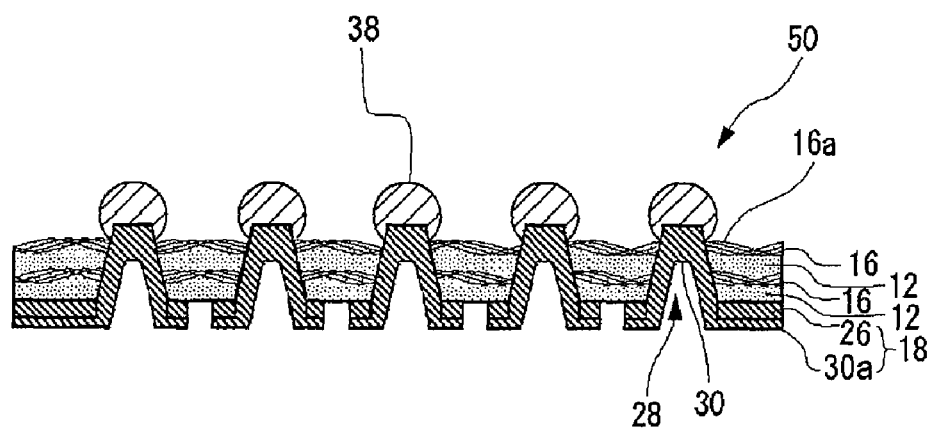
FIG. 7 is a sectional view showing the solder bumped device mounting board according to the first embodiment.

A description will now be given of a method of manufacturing a solder bumped device mounting board produced by forming bumps on the device mounting board 10. FIG. 6 is a sectional view showing a step in the method of manufacturing the solder bumped device mounting board according to the first embodiment. FIG. 7 is a sectional view showing the solder bumped device mounting board according to the first embodiment.

First, the device mounting board 10 as described above is prepared. Molten solder 36 is supplied to the entirety of the surface of the device mounting board 10 including the surface of the exposed part 16a of the glass cloth 16. The solder 36 may be supplied by spraying the board with the molten solder 36. Alternatively, the device mounting board 10 may itself be immersed in a solder tank. Still alternatively, solder paste may be provided on the exposed part 16a by screen printing and subsequently heated by a reflow process. Using any of these methods, the molten solder 36 can be easily supplied to the entirety of the surface of the device mounting board 10 including the surface of the exposed part 16a.

When the molten solder 36 is supplied to the entirety of the surface of the device mounting board 10 including the surface of the exposed part 16a in order to form solder bumps on the electrodes, the solder 37 is likely to flow toward the electrode 14. This is because the exposed part 16a around the electrode 14 has an angle of contact with solder larger than that of the resin so that the solder 37 is more likely to be repelled on the exposed part 16a.

The glass cloth 16 according to the first embodiment is produced such that glass fibers oriented in a plurality of intersecting directions are woven as shown in FIG. 5. Therefore, periodically spaced elevations and recesses are formed in the exposed part 16a. Thus, the solder 37 repelled by the exposed part 16a is likely to be moved due to a local tilt with the result that a part of the solder 37 is moved toward the electrode 14. Since the electrode 14 is less repellent to the solder 37 than the glass cloth 16, the solder 37 once reaching the electrode 14 is likely to remain on the electrode 14. As a result, a solder bump 38 is formed on the electrode 14 in a self-organizing process, as shown in FIG. 7. Thus, the solder bump 38 is formed on the electrode 14 with high precision.

Meanwhile, the solder 37 not reaching the electrode 14 or not contributing to the formation of the solder bump 38 flows toward the recess of the exposed part 16a, creating a solder ball having a certain size and so can be easily removed from the surface of the device mounting board 10 by, for example, tilting the device mounting board 10. According to the manufacturing method of the embodiment, a solder bumped device mounting board 50 can be manufactured easily.

Figure 8:
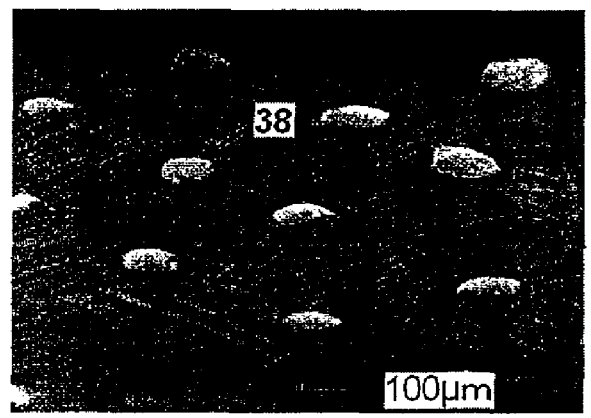
FIG. 8 is an image of the surface of the solder bumped device mounting board according to the first embodiment taken with a scanning electron microscope.

FIG. 8 is an image of the surface of the solder bumped device mounting board 50 according to the first embodiment taken with a scanning electron microscope. FIG. 8 shows how the solder bumps 38 are formed on the electrodes 14.

Figure 9A:
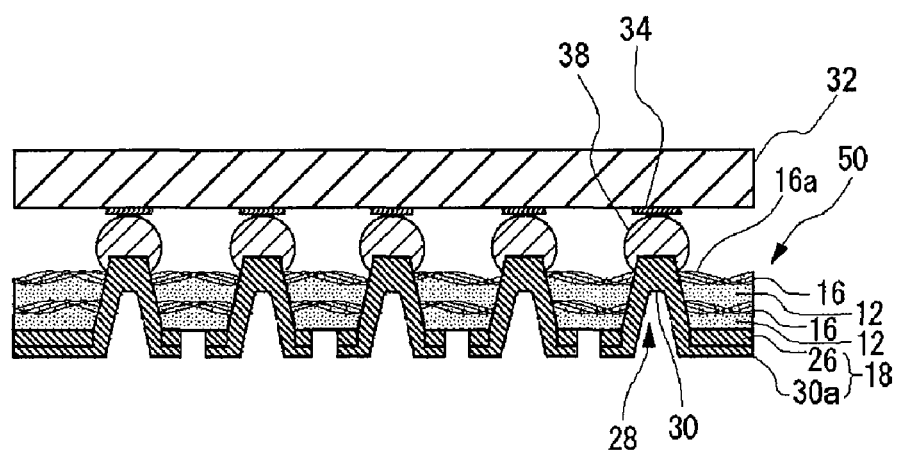
FIGS. 9A and 9B are sectional views showing steps in the method of manufacturing the semiconductor module according to the first embodiment.
Figure 9B:
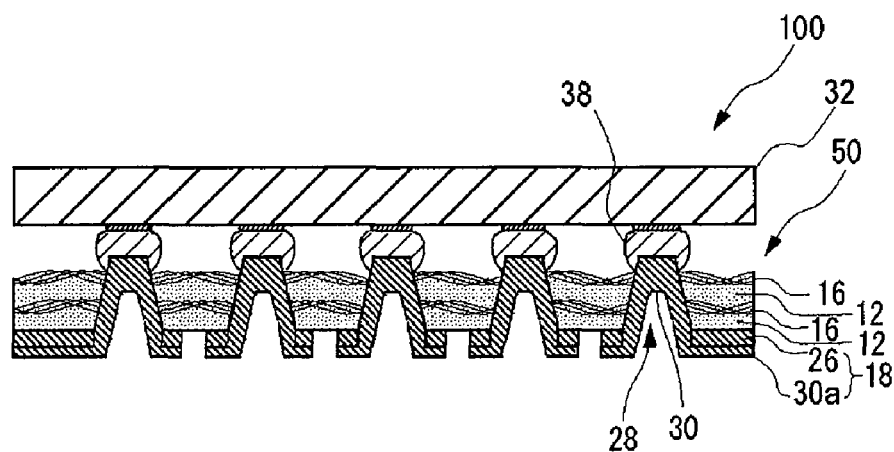

FIGS. 9A and 9B are sectional views showing steps in the method of manufacturing the semiconductor module according to the first embodiment. First, as shown in FIG. 9A, a semiconductor device 32 such as an LSI or an IC is mounted on the solder bumped device mounting board 50. In this process, an electrode terminal 34 of the semiconductor device 32 and the solder bump 38 of the device mounting board 10 are aligned and placed in contact with each other.

Thereafter, a reflow process is performed in a heated environment so that the device mounting board and the semiconductor device 32 are bonded by the solder bump 38, as shown in FIG. 9B, producing a semiconductor module 100. Since the solder bumped device mounting board 50 and the semiconductor device 32 are bonded via the solder bump 38 formed on the electrode 14 with precision, the reliability of the semiconductor module 100 is improved.

Second Embodiment

In the device mounting board 10 described above, the electrode 14 is provided so as to project from the exposed part 16a. The second embodiment is largely different from the first embodiment in that the electrode 14 is provided at a location recessed from the exposed part 16a. A description of the second embodiment will now be given, highlighting the difference from the first embodiment.

Figure 10A:
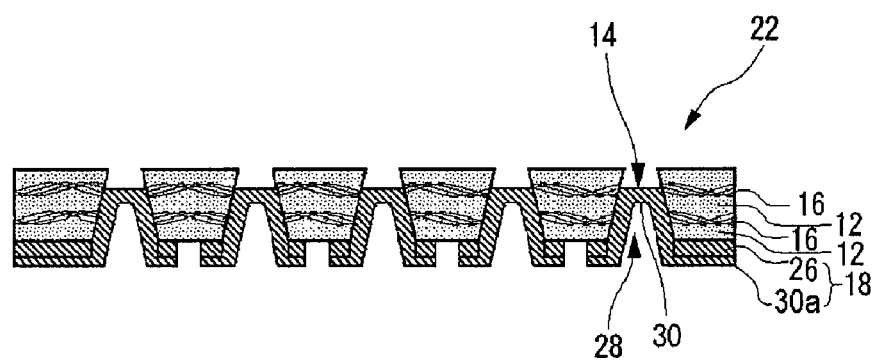
FIGS. 10A and 10B are sectional views showing steps in the method of manufacturing the device mounting board according to the second embodiment.
Figure 10B:
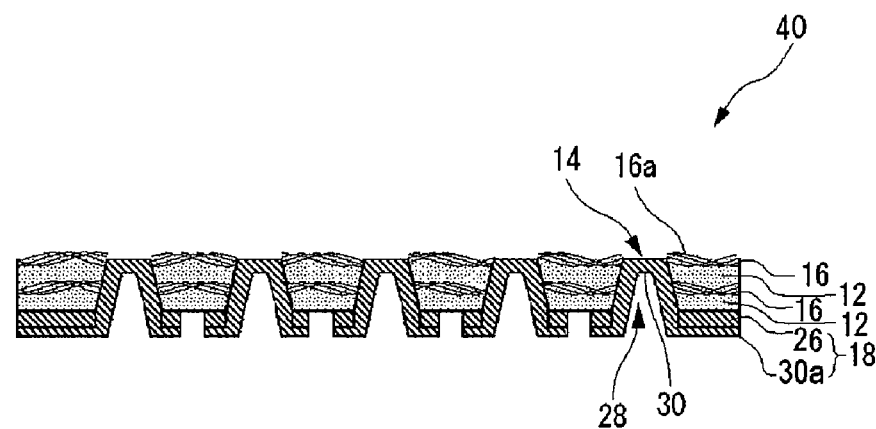

FIGS. 10A and 10B are sectional views showing steps in the method of manufacturing the device mounting board according to the second embodiment. The device mounting board according to the second embodiment is manufactured using the substrate 22 in which the opening 28 is formed using laser, as in the steps shown in FIG. 2.

As shown in FIG. 10A, the first conductive film 24 is removed and, additionally, a part of the via conductor 30 is removed by etching. This produces the electrode 14 in the insulating layer 12. Subsequently, as shown in FIG. 10B, the resin on the surface of the insulating layer 12 on which the electrode 14 is exposed is melted and removed so that a part of the glass cloth 16 is exposed. This produces a device mounting board 40. Since the electrode is formed by removing a part of the via conductor 30 according to the second embodiment, the device mounting board in which the exposed part 16a is higher than the electrode 14 is manufactured easily.

Figure 11:
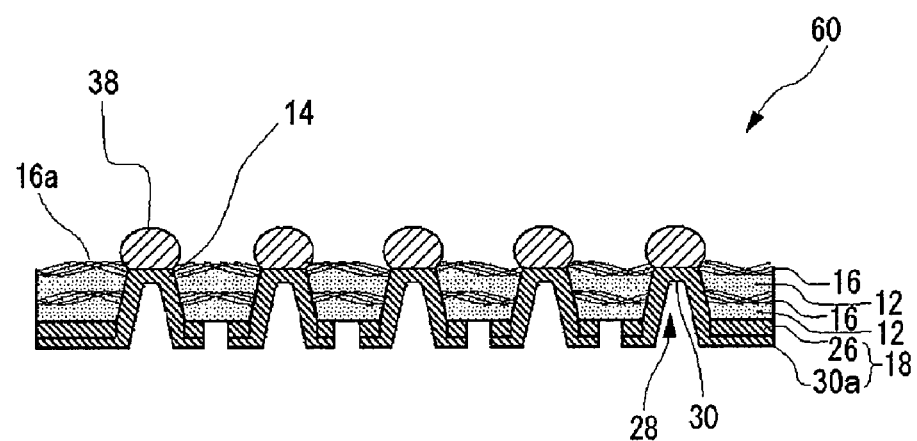
FIG. 11 is a sectional view of the solder bumped device mounting board according to the second embodiment.

FIG. 11 is a sectional view of a solder bumped device mounting board 60 according to the second embodiment. As in the first embodiment, the device mounting board 40 is prepared first. Subsequently, molten solder 36 is supplied to the surface of the exposed part 16a of the glass cloth 16, as in the first embodiment. As a result, the solder bump 38 is formed on the electrode 14 in a self-organizing process, as in the first embodiment. Since the electrode of the device mounting board 40 is formed by removing a part of the via conductor 30, the electrode 14 is provided at a location recessed from the exposed part 16a. In other words, the electrode 14 is formed inside a through hole extending through the glass cloth 16. Therefore, the solder flows more easily toward the electrode 14. Once the molten solder reaches the electrode 14, the solder will not leave the electrode 14 easily so that the solder bump 38 is formed with higher precision.

Third Embodiment

A through electrode is given by way of example as constituting the device mounting boards 10 and 60 described above. However, the present invention is equally useful for electrodes not necessarily extending through the covering such as glass cloth. A description of the third embodiment will now be given, highlighting the difference from the first and second embodiments.

Figure 15A:
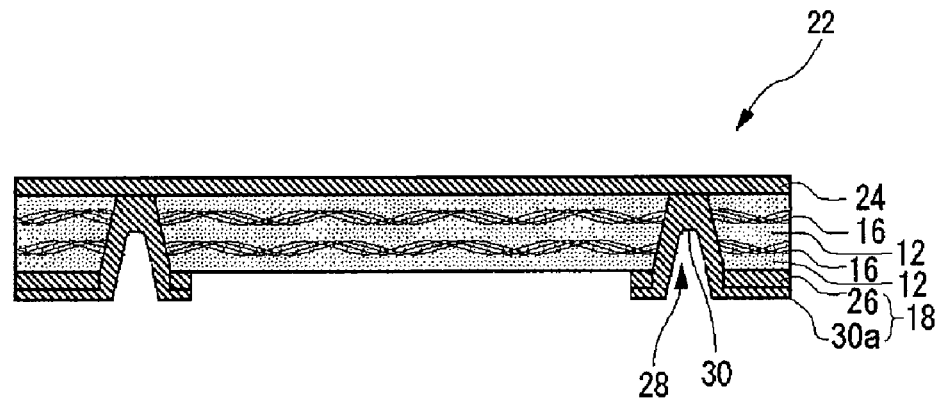
FIGS. 15A-15C are sectional view showing steps in the method of manufacturing the device mounting board according to the third embodiment.
Figure 15B:
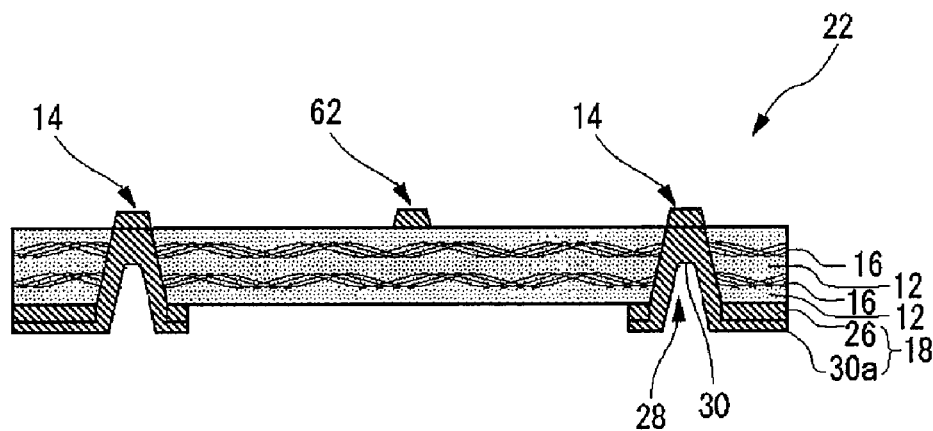
Figure 15C:
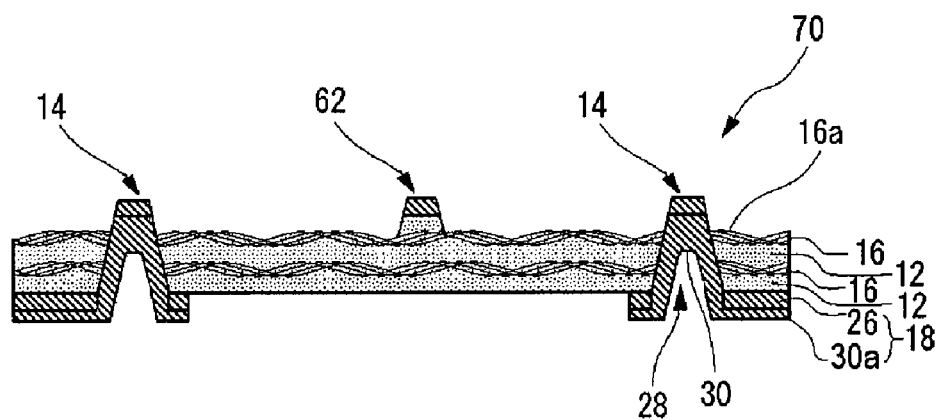

FIGS. 15A-15C are sectional views showing steps in the method of manufacturing the device mounting board according to the third embodiment. The device mounting board according to the embodiment is manufactured using the substrate 22 as shown in FIG. 15A in which the wiring layer 18 is formed on the other surface through the steps as shown in FIG. 2A-3B. A mask that covers areas on the first conductive film 24 shown in FIG. 15A corresponding to a bump 62 and the electrode 14 is formed by the lithographic process. The remaining areas are removed by etching. This will form a plurality of electrodes on one surface of the substrate 22.

Subsequently, as shown in FIG. 15C, the resin on the surface of the insulating layer 12 on which the bump 62 and the electrode 14 are exposed is melted and removed so that a part of the glass cloth 16 is exposed. This produces the device mounting board 70. The resin may be removed by etching using O$_2$ plasma treatment so as to expose the glass cloth 16. Thus, according to the manufacturing method of the third embodiment, the bump 62 that functions as an electrode not extending through the glass cloth 16 is formed on the glass cloth 16.

Figure 16:
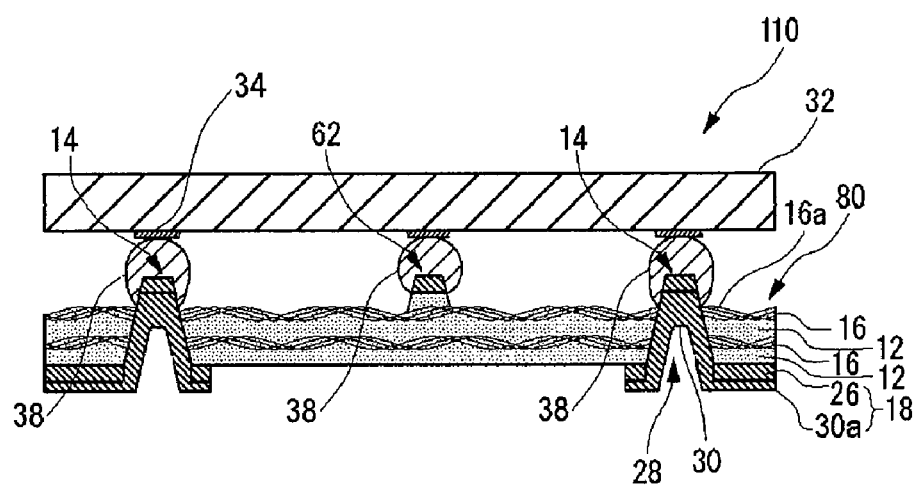
FIG. 16 is a sectional view of the solder bumped device mounting board according to the third embodiment.

FIG. 16 is a sectional view of the solder bumped device mounting board according to the third embodiment. The bump 62 and the electrode 14 formed using the method shown in FIGS. 15A-15C are surrounded by the exposed glass cloth 16. When, for example, molten solder is supplied to the glass cloth 16, the solder is likely to be repelled on the exposed part 16a of the glass cloth 16. This is because the glass cloth 16 has an angle of contact with solder larger than that of the resin. As a result, solder is attached to the electrode 14 or the bump 62 in a self-organizing process, as shown in FIG. 16, forming the solder bump 38.

Thus, according to the manufacturing method of the third embodiment, the solder bump 38 can be easily formed with precision on the electrode 14, which includes the via conductor 30, and on the bump 62, a projecting electrode. Thus, the solder bumped device mounting board 80 can be manufactured easily. A semiconductor device 32 such as an LSI or an IC is then mounted on the solder bumped device mounting board 80. In this process, the electrode terminal 34 of the semiconductor device 32 and the solder bump 38 of the device mounting board 10 are aligned and placed in contact with each other.

Thereafter, a reflow process is performed in a heated environment so that the device mounting board 70 and the semiconductor device 32 are bonded by the solder bump 38, as shown in FIG. 16, producing a semiconductor module 110. Since the solder bumped device mounting board 80 and the semiconductor device 32 are bonded via the solder bump 38 formed with precision on the electrode 14, which includes the via conductor 30, and on the bump 62, the reliability of connection of the semiconductor module 110 is improved.

Since the bump 62 does not extend through the glass cloth 16, the bump 62 may be formed as part of a wiring pattern conducting with another area. For this reason, when solder is supplied to the glass cloth 16 in the device mounting board on which the bump 62 is formed, solder may be attached to the entirety of the wiring pattern. Accordingly, a method for forming solder bumps only at locations in the wiring pattern corresponding to the bump 62 is called for.

Figure 17:
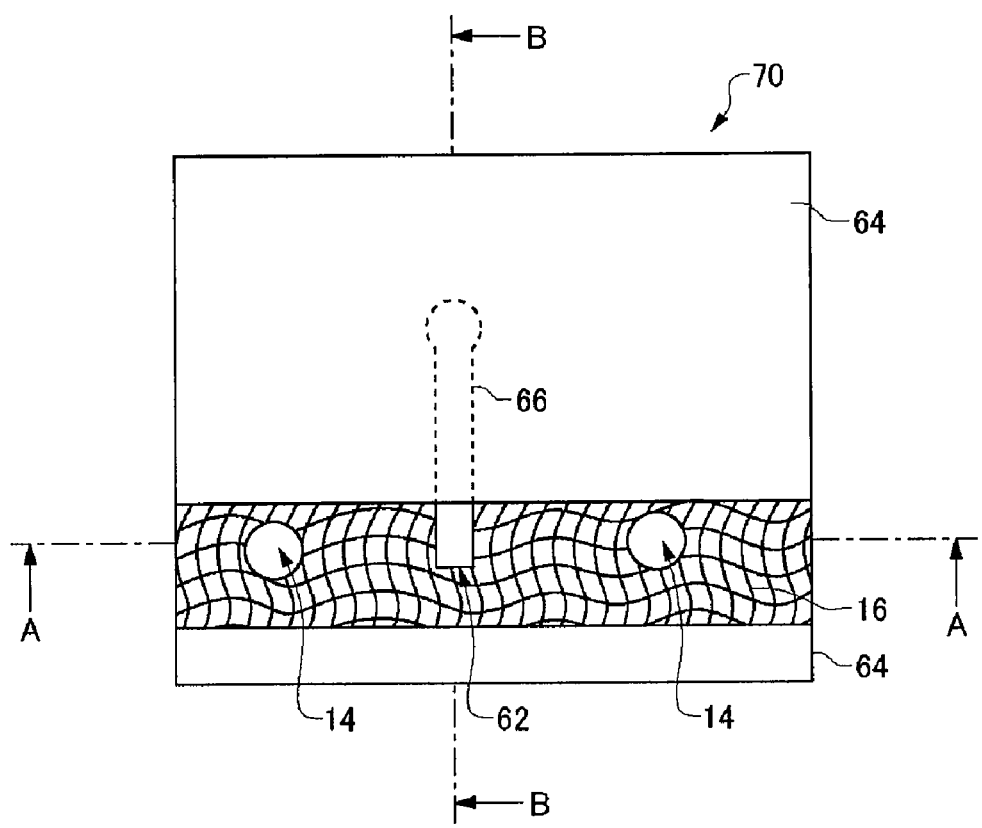
FIG. 17 is a top view of a device mounting board in which a protective film for preventing solder from being attached to an area on a wiring pattern outside a bump, wherein a part of the pattern functions as the bump.

FIG. 17 is a top view of a device mounting board in which a protective film for preventing solder from being attached to an area on a wiring pattern outside the bump 62, wherein a part of the pattern functions as the bump 62. The protective film 64 is a resin layer formed subsequent to the step of FIG. 15C to cover a part of a wiring pattern 66 including the bump 62, using a known exposure step. The sectional view of the device mounting board 70 shown in FIG. 15C corresponds to the A-A section of FIG. 17.

Figure 18:
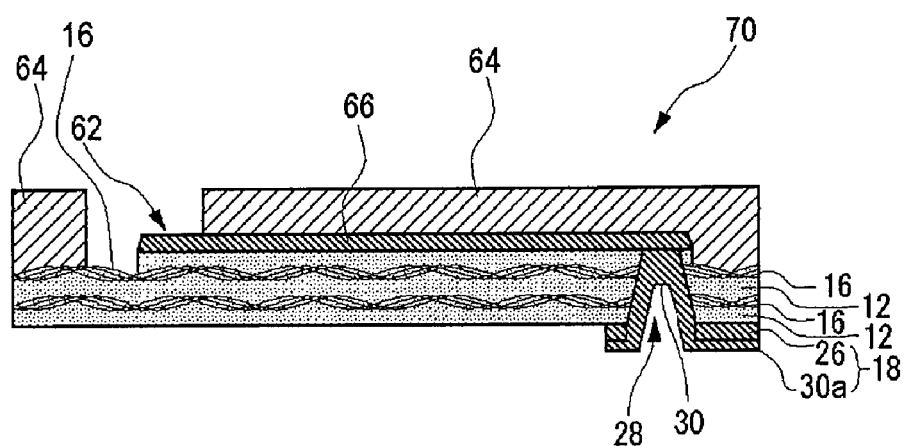
FIG. 18 is a B-B section of the device mounting board shown in FIG. 17.

FIG. 18 is the B-B section of the device mounting board shown in FIG. 17. As shown in FIG. 18, a part of the bump 62 is exposed and the exposed part is surrounded by the glass cloth 16. As described, even in the case of the bump 62 not extending through the glass cloth 16, the solder supplied is likely to flow toward the bump 62 since the exposed part of the bump 62 is provided in an area surrounded by the exposed glass cloth 16.

Fourth Embodiment

Figure 19:
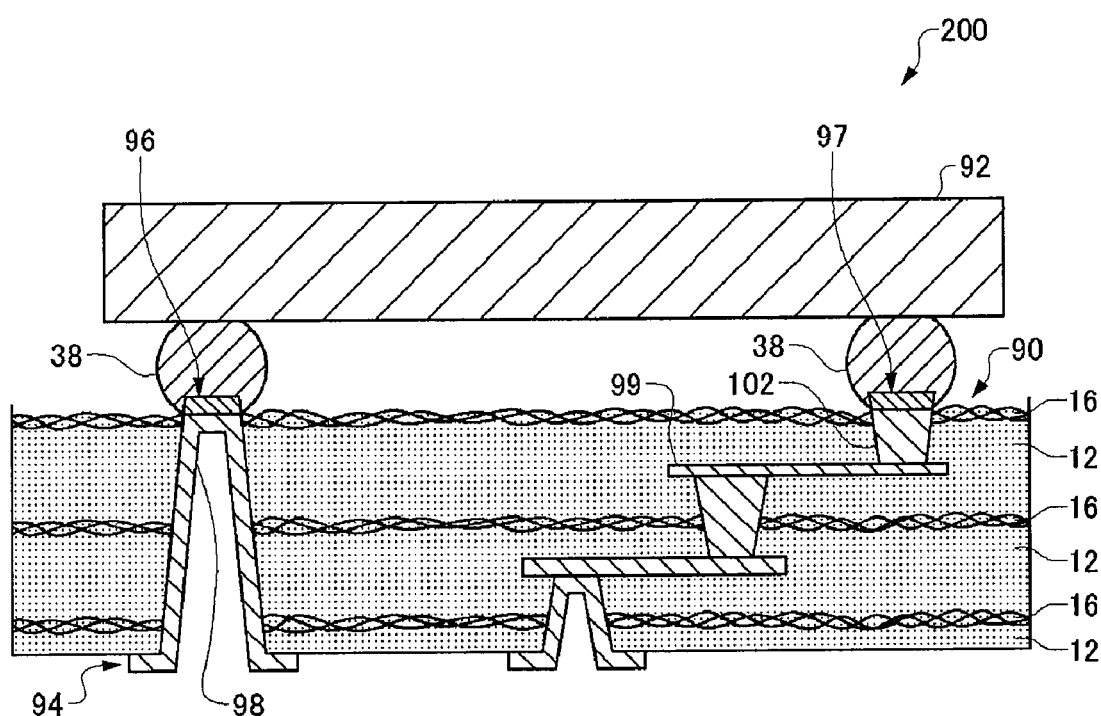
FIG. 19 is a sectional view of a semiconductor module according to the fourth embodiment.

FIG. 19 is a sectional view of a semiconductor module according to the fourth embodiment. A semiconductor module 200 according to the fourth embodiment is provided with a device mounting board 90 in which a multilayer (four layers) wiring pattern is formed, and a semiconductor device 92 bonded to the board 90 via the solder bump 38 formed on an electrode of the board 90. The semiconductor device 92 is provided with an electrode terminal (not shown).

The device mounting board 90 is configured such that a wiring layer 94 is formed on the lower surface of the insulating layer 12 shown in FIG. 19. The electrode 96 according to the fourth embodiment is formed in a through hole extending through the insulating layer 12. In other words, the electrode 96 is formed in a hole extending through the glass cloth 16 and includes a via conductor 98 having one end thereof connected to the wiring layer 94. In other words, the other end of the via conductor 98 functions as an electrode connected to the semiconductor device 92. An electrode 97 according to the fourth embodiment includes a filled via 102 conducting with a wiring layer 99 formed inside the device mounting board 90. The filled via 102 is formed to extend through the glass cloth 16. The advantage as already discussed is equally available in the semiconductor module 200 constructed described above.

Fifth Embodiment

A description will be given of a mobile device provided with the semiconductor module described above. Although a cell phone is illustrated by way of example, the mobile device may be an electronic device such as a personal digital assistant (PDA), a digital video camera (DVC), and a digital still camera (DSC).

Figure 12:
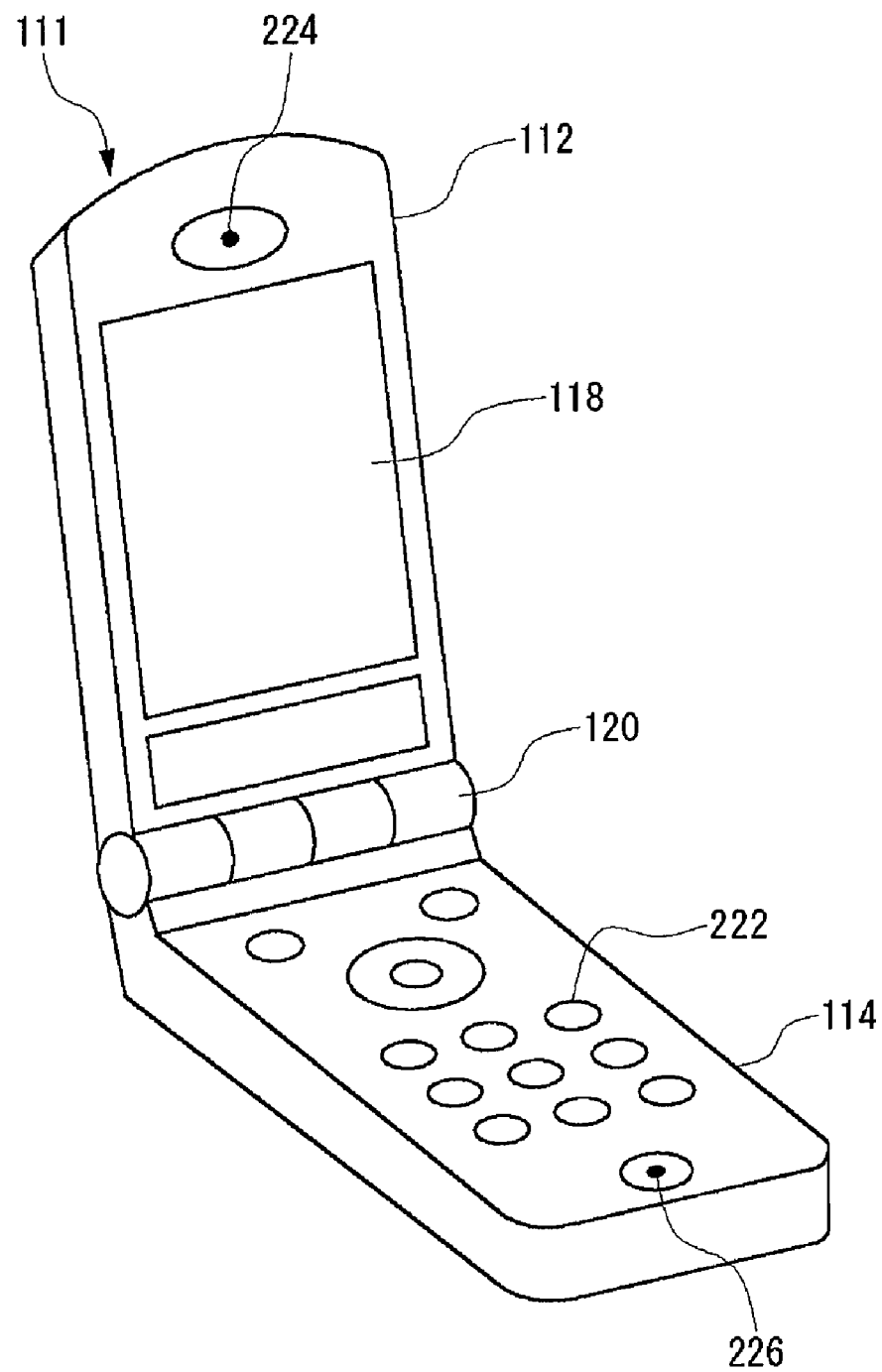
FIG. 12 shows the structure of the cell phone according to the fifth embodiment.

FIG. 12 shows the structure of a cell phone provided with the semiconductor module according to the fifth embodiment. A cell phone 111 is of a structure in which a first casing 112 and a second casing 114 are connected to each other via a movable part 120. The first casing 112 and the second casing 114 are rotatable around the movable part 120. The first casing 112 is provided with a display unit 118 for displaying information such as characters and images, and with a speaker unit 224. The second casing 114 is provided with a control 222 such as control buttons, and with a microphone 226. The semiconductor module according to any of the foregoing embodiments is built inside the cell phone 111.

Figure 13:
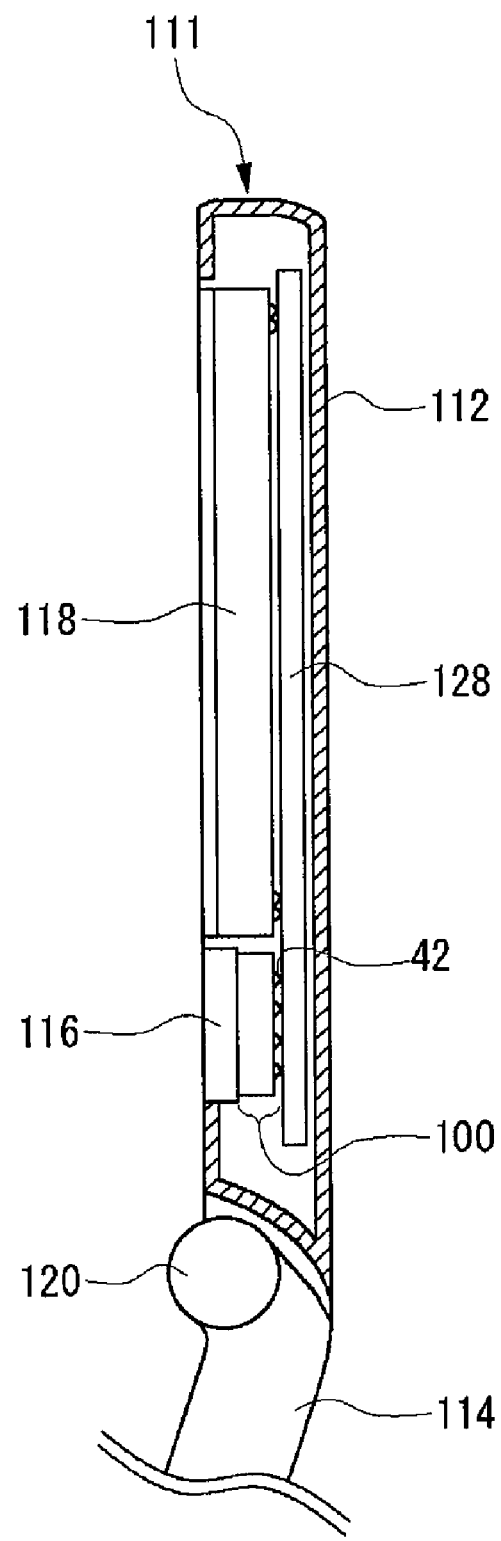
FIG. 13 is a partial sectional view of the cell phone shown in FIG. 12.

FIG. 13 is a partial sectional view of the cell phone shown in FIG. 12 (a sectional view of the first casing 112). The semiconductor module 100 according to the fifth embodiment is mounted on a printed board 128 via a solder bump 42, and is electrically connected to the display unit 118, etc. via the printed board 128. A heat dissipating substrate 116 embodied by, for example, a metal plate is provided on the back surface (the surface opposite to the solder bump 42) of the semiconductor module 100. The heat generated by, for example, the semiconductor module 100 is prevented from being contained inside the first casing 112 and is efficiently discharged outside the first casing 112.

In the mobile device provided with the semiconductor module 100 according to the fifth embodiment, the reliability of connection between the semiconductor device and the device mounting board is improved. This eventually improves the reliability of connection of the semiconductor module 100 and the reliability of the mobile device carrying the semiconductor module 10.

While the embodiments of the present invention have been described using specific terms, such description is for illustrative purposes only, and it is to be understood that changes and variations may be made without departing from the spirit or scope of the present invention. Variations or modifications to the design of the embodiments may occur to those skilled in the art. Such variations or modifications are also intended to be encompassed within the scope of the present invention.

For example, while the wiring layer in the embodiments is described as comprising a single layer, the wiring layer may comprise multiple layers.

The step of forming bumps in the embodiments may be such that a plate is provided at a certain height from the surface of the device mounting board so that molten solder is supplied to a gap between the device mounting board and the plate. This ensures that the height of the solder bumps is uniform.

The step of removing solder not contributing to the formation of solder bumps may be such that the aforementioned plate is removed so that the device mounting board is tilted with the plate removed. In this way, the solder that flows to and remains in the covering without forming a solder bump on the electrode is easily removed from the device mounting board.

What is claimed is:

1. A device mounting board comprising:
an insulating layer formed of an insulating resin;
a covering that coats the surface of the insulating layer; and
an electrode provided in an area surrounded by the covering, wherein
the covering has an angle of contact with solder larger than that of the resin, and
the covering is a glass cloth formed such that glass fibers oriented in a plurality of intersecting directions are woven.

2. The device mounting board according to claim 1, wherein the covering has elevations or recesses.

3. A semiconductor module comprising:
a semiconductor device having an electrode terminal; and
the device mounting board according to claim , wherein
the electrode terminal and the electrode are bonded by solder.

4. A mobile device carrying the semiconductor module according to claim 3.

5. A device mounting board comprising:
an insulating layer formed of an insulating resin;
a covering that coats the surface of the insulating layer; and
an electrode provided in a through hole extending through the covering, wherein
the covering has an angle of contact with solder larger than that of the resin, and
the covering is a glass cloth formed such that glass fibers oriented in a plurality of intersecting directions are woven.

6. The device mounting board according to claim 5, wherein the covering has elevations and recesses.

7. The device mounting board according to claim 5, further comprising;
a wiring layer formed on the surface of the insulating layer opposite to the surface on which the covering is formed; and
a via conductor electrically connecting the electrode with the wiring layer.

8. A semiconductor module comprising:
a semiconductor device having an electrode terminal; and
the device mounting board according to claim 5, wherein
the electrode terminal and the electrode are bonded by solder.

9. A mobile device carrying the semiconductor module according to claim 8.

* * * * *